United States Patent [19]

Shuttleworth

[11] 4,090,192
[45] May 16, 1978

[54] ELECTRIC PUKE CODE MODULATION ENCODING ARRANGEMENTS

[75] Inventor: Anthony Ernest Shuttleworth, Burbage, England

[73] Assignee: The General Electric Company Limited, London, England

[21] Appl. No.: 810,998

[22] Filed: Jun. 29, 1977

Related U.S. Application Data

[63] Continuation of Ser. No. 624,749, Oct. 23, 1975, abandoned.

[30] Foreign Application Priority Data

Oct. 29, 1974 United Kingdom ............... 46751/74

[51] Int. Cl.² ............................................. H03K 13/02
[52] U.S. Cl. ........................ 340/347 NT; 179/15 AV; 340/347 M
[58] Field of Search .... 340/347 M, 347 AD, 347 NT, 340/347 CC; 324/99 D; 179/15 AV; 325/38 R, 141

[56] References Cited

U.S. PATENT DOCUMENTS

| 3,560,659 | 2/1971 | Greefkes et al. ............... 179/15 AV |
| 3,631,467 | 12/1971 | Vojvodich et al. .......... 340/347 NT |
| 3,649,826 | 3/1972 | Larsson et al. ........... 340/347 NT X |
| 3,855,585 | 12/1974 | Stout ........................... 340/347 AD |
| 4,010,422 | 3/1977 | Wouda ............................... 325/141 |

Primary Examiner—Thomas J. Sloyan
Attorney, Agent, or Firm—Kirschstein, Kirschstein, Ottinger, Frank & Cobrin

[57] ABSTRACT

A P.C.M. compression-law coder in which sample values in different segments of the dynamic range of the coder are allotted different charging time intervals in an integrator circuit, the segment number forming one part of the resultant encoded signal and digital measure of the discharge time of the integrator circuit at constant current providing another part of the encoded signal.

8 Claims, 2 Drawing Figures

ELECTRIC PUKE CODE MODULATION ENCODING ARRANGEMENTS

This is a continuation of application Ser. No. 624,749, filed Oct. 23, 1975, abandoned.

The present invention relates to electric encoding arrangements.

In particular the invention is concerned with encoding arrangements in which an electric input signal is periodically sampled and, for each sample, a group of pulses generated which represent the value of that sample. Such encoding arrangements are used for example in pulse code modulation transmission systems.

According to one aspect of the present invention in an electric encoding arrangement in which a variable electric input signal is periodically sampled and, for each sample, a group of pulses generated which represents the magnitude of that sample, there are provided means to charge a capacitor at a rate determined by the magnitude of a sample for a period selected in dependence upon the magnitude of the sample, and counter means to measure the time interval taken by the subsequent discharge of said capacitor at a predetermined rate to a reference level by counting regularly occurring clock pulses during that time interval, at least part of the count reached at the end of said time interval serving as a basis for deriving some of said group of pulses, others of said group of pulses serving to indicate said selected period.

According to another aspect of the present invention in an electric encoding arrangement for a pulse code modulation transmission system in which the instantaneous value of an input signal applied to the arrangement is sampled and stored temporarily and a capacitor is arranged to be charged for a predetermined period at a rate which is dependent upon the magnitude of the stored sample, the subsequent discharge of this capacitor serving to determine a time interval or pulse-length which is proportional to the magnitude of the stored sample, there is provided means responsive to the magnitude of the stored sample to select from two or more predetermined periods the period for which the capacitor is to be charged in respect of that particular stored sample.

According to another aspect of the invention, an electric encoding arrangement for a pulse code modulation transmission system comprises means periodically to sample an electric input signal and to store temporarily a voltage proportional to the value of that input signal during the sampling period, a capacitor, means to charge said capacitor at a rate determined by said stored voltage for a first predetermined period, means to derive from the value of charge on the capacitor at the end of said first period a first digitally coded signal denoting in which of a plurality of contiguous segments or ranges of voltage the stored voltage lies, means to charge the capacitor a second time at a rate determined by said stored voltage for a second period determined by the said segment in which said voltage lies, and means to derive a second digitally coded signal representing the value of charge then acquired by said capacitor, the complete coded signal representing the value of said stored voltage comprising at least parts of said first and second digitally coded signals.

Preferably said capacitor forms part of an integrator circuit to an input of which said stored voltage is applied. The means to derive said first and second digitally coded signals may comprise a counter which is arranged to count regularly occurring clock pulses during time intervals following said first and second charging periods respectively during which said capacitor discharges to a reference level at a predetermined rate. There may be provided means to alter the value of said first digitally coded signal in dependence upon the value of said second digitally coded signal.

An electric encoding arrangement in accordance with the present invention, for a pulse code modulation transmission system, will now be described by way of example with reference to the accompanying drawings, of which:

Figure 1:
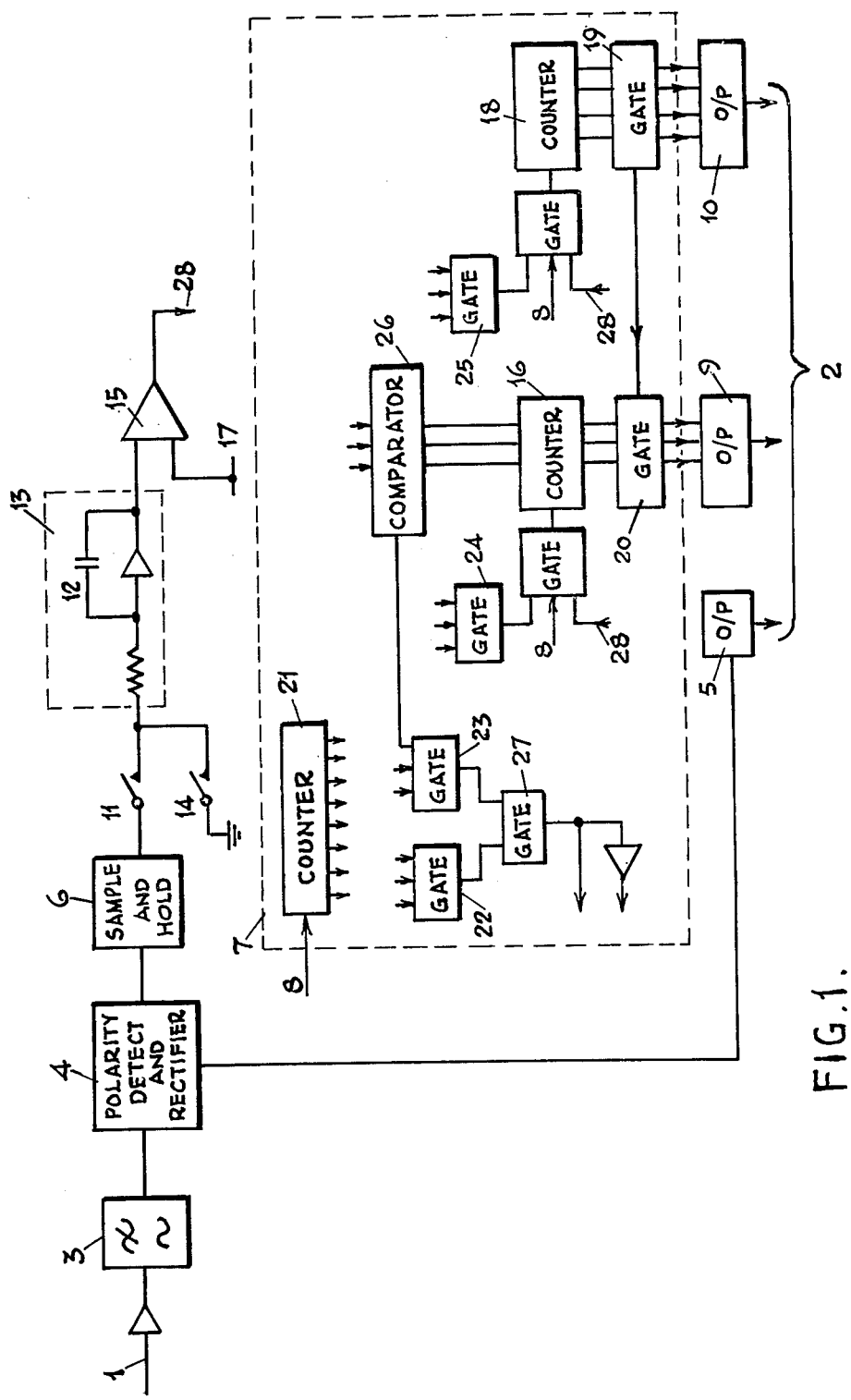
FIG. 1 shows the arrangement schematically.

Referring to the drawings the encoding arrangement is required to produce in respect of an "analogue" signal at an input 1 an eight-bit binary coded signal at an output 2. The analogue signal, which may for example represent a speech signal, is amplified and applied by way of a low-pass filter 3 to a polarity-detecting and rectifying circuit 4. This circuit generates a single-bit digital signal which is passed to an output stage 5 and which represents the polarity of the input signal, and also presents to a sample and hold circuit 6 a unidirectional signal which represents the magnitude of the input signal. The circuit 6 is arranged periodically to store a voltage proportional to the instantaneous magnitude of the input signal during a sampling pulse period.

The stored voltage is encoded, in a cycle controlled by a control logic arrangement 7 which itself is timed by clock pulses at a repetition rate of, say, 2 mega hertz on a line 8, as a three-digit segment signal which is passed to an output stage 9 and a four-digit linear code signal which is passed to an output stage 10. The segment signal indicates in which of eight contiguous segments covering the dynamic range of the input signal any particular stored sample voltage falls, each higher segment number representing twice the voltage range of the segment next below, while the linear code signal indicates in which of 16 equal voltage intervals within the respective segment the stored sample voltage falls.

Figure 2:
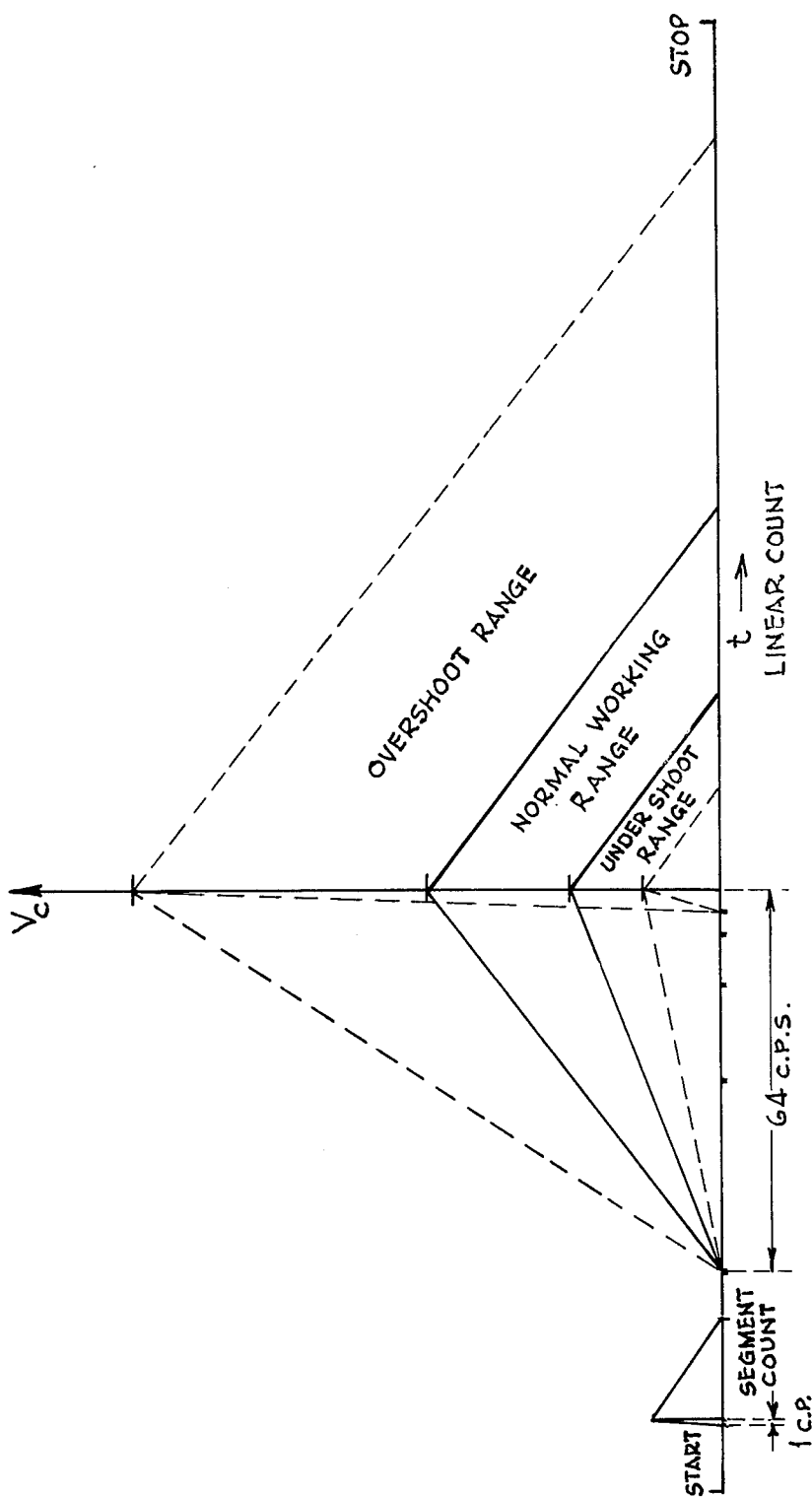
FIG. 2 shows a voltage/time diagram illustrating the operation of the arrangement.

In response to a signal from the control logic arrangement 7 a switch 11, which may for example comprise a field-effect transistor (not shown) is closed for a period of, say, one clock pulse so that a capacitor 12 forming part of an integrator circuit 13 begins to charge towards the voltage of the stored sample. At the end of this clockpulse period the switch 11 is opened and a similar switch 14 is closed so that the capacitor 12 discharges, and under the control of a differential amplifier 15 clockpulses are gated to a counter 16 for the period taken for the capacitor 12 to discharge to a reference voltage on a line 17. The count state reached by the counter 16 then provides the basis for the segment signal. It will be appreciated that because of the relationship between the voltage ranges or segments, samples in successively higher segments will tend to produce a count state occupying successively more stages of the counter 16, whereby samples in different segments may be distinguished and appropriate segment numbers allocated. Depending on which segment number is indicated the switch 11 is then closed for from four to 64 clock pulse periods, signals in the highest two segments being given four clockpulse periods, the next highest eight, the next highest 16, the next highest 32 and the three lowest 64 clockpulse periods. In this way it is ensured that the charge acquired by the capacitor 12 during the allotted period normally falls within a given working range, as shown in FIG. 2, with allowance being made for overshooting or undershooting this working range if the segment number has been incorrectly ascribed.

At the end of the allotted charging period the switch 11 is opened and the switch 14 closed again, and a counter 18 is used to count clock pulses to measure the discharge period. For a charge on the capacitor 12 within the given band the counter 18 will record a count of from 32 to 63, that is a six digit count, while undershoot and overshoot will record counts from up to 31 and from 64 to 127 respectively. Since four-digit accuracy only is required of the linear count the least significant digit is discarded in a stage 19 and the next four digits passed to the output stage 10, the sixth digit serving to indicate that the count is in the normal working range and that no change to the segment number is required. If the count falls outside the normal range due to over or undershoot the selection of four digits for the linear code signal may be shifted up or down by one digit to obtain linear code signals of the correct weight and, if necessary, the segment count may be altered by one either way in a transfer gating circuit 20.

The complete sequence of encoding one analogue signal presented at the input 1 is timed by an eight-stage binary counter 21, so that the sequence extends over 256 clock pulse periods or approximately 125 microseconds. Outputs from different stages of the counter 21 are taken to gating circuits 22, 23, 24 and 25, and a digital comparator 26, to define different periods within the coding cycle. The gating circuits 22 and 23, in conjuction with an "OR" gate 27, are arranged to define the periods during which the switches 11 and 14 are operated. The segment counter 16 and linear counter 18 are arranged to operate during respective parts of the coding cycle, by means of the gating circuits 24 and 25 respectively, so as to count clockpulses on the inputs 8 while the output of the differential amplifier 15 on the path 28 indicates discharge of the capacitor 12 towards the reference potential.

The segment count registered by the counter 16 is presented to the comparator 26 so that the second charging period for the capacitor 12 commences at a variable point, but terminates at a fixed point, in the coding cycle in dependence upon the segment count.

I claim:

1. An electric encoding arrangement for a pulse code modulation transmission system comprising:
   (A) means periodically to sample an electric input signal and to store temporarily a voltage proportional to the value of that input signal during the sampling period,
   (B) a capacitor,
   (C) means to charge said capacitor to a first charged state from a reference level for a first predetermined period at a rate determined by said stored voltage,
   (D) means to discharge said capacitor to said reference level from said first charged state,
   (E) means responsive to the capacitor discharge time from said first charged state and, hence, the value of charge on the capacitor in its first charged state to derive a first digitally coded signal denoting in which of a plurality of contiguous ranges of voltages the stored voltage in the first charged state lies,
   (F) means to charge the capacitor to a second charged state from a reference level at a rate determined by said stored voltage, the second charging being for a second period selected from a plurality of predetermined periods in dependence upon the segment in which said first stored voltage lies,
   (G) means to discharge said capacitor from said second charged state to said reference level after said second predetermined period,
   (H) means responsive to the capacitor discharge time from said second charged state and, hence, to the value of the charge on the capacitor in its second charged state derive a second digitally coded signal which represents the value of charge acquired by said capacitor at the end of said second predetermined period,
   (I) the complete coded signal representing the value of said stored sample voltage comprising at least parts of said first and second digitally coded signals.

2. An electric encoding arrangement in accordance with claim 1 wherein said capacitor forms part of an integrator circuit to an input of which said stored voltage is applied.

3. An electric encoding arrangement in accordance with claim 1 wherein the means to derive said first and second digitally coded signals comprises a counter which is arranged to count regularly occurring clock pulses during time intervals following said first and second charging periods respectively during which said capacitor discharges to said reference level at a perdetermined rate.

4. An electric encoding arrangement in accordance with claim 1 wherein the contiguous ranges are of progressively different values.

5. An electric encoding arrangement in accordance with claim 1 wherein the contiguous ranges are of progressively larger values.

6. An electric encoding arrangement in accordance with claim 1 wherein the contiguous ranges are of geometrically progressive different values.

7. An electric encoding arrangement in accordance with claim 1 wherein the contiguous ranges are of geometrically progressively larger values.

8. An electric encoding arrangement in accordance with claim 7 wherein the geometric progression ratio is 2.

* * * * *